US007090504B2

(12) United States Patent
Hou

(10) Patent No.: US 7,090,504 B2
(45) Date of Patent: Aug. 15, 2006

(54) LAND GRID ARRAY SOCKET HAVING IMPROVED TERMINALS

(75) Inventor: Sung-Pei Hou, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/001,266

(22) Filed: Nov. 30, 2004

(65) Prior Publication Data

US 2005/0124183 A1 Jun. 9, 2005

(30) Foreign Application Priority Data

Dec. 9, 2003 (TW) .............................. 92221600 U

(51) Int. Cl.
*H01R 12/00* (2006.01)
*H05K 1/00* (2006.01)

(52) U.S. Cl. ......................................... 439/66; 439/515

(58) Field of Classification Search .................. 439/66, 439/515

See application file for complete search history.

(56) References Cited

U.S. PATENT DOCUMENTS 4,655,519 A * 4/1987 Evans et al. .................. 439/74

* cited by examiner

*Primary Examiner*—Javaid H. Nasri
(74) *Attorney, Agent, or Firm*—Wei Te Chung

(57) ABSTRACT

A land grid array (LGA) socket is adapted to receive an IC module (40) and mounted on a PCB (50). The socket (1) includes an insulative housing (30) having a plurality of passageways (302) and a plurality of electrical terminals (10) received in the passageways. Each of the terminals includes a retention portion (12), a pressing arm (16) bent slantwise and extending upwardly from an end of the retention portion, and a contacting ann (18) bent slaniwise and extending downwardly from another end of the retention portion. At least one connecting plate (14) connects the pressing urn and the contacting arm, the connecting plate is separate from the retention portion, thereby decreasing impedance of the terminal.

2 Claims, 5 Drawing Sheets

LAND GRID ARRAY SOCKET HAVING IMPROVED TERMINALS

BACKGROUND OF THE INVENTION

1. Field of the Invention

The present invention relates to the art of electrical connectors, and more particularly to a land grid array (LGA) socket having electric connecting between an IC module and a printed circuit board (PCB).

2. The Prior Art

An LGA socket mounted on a PCB comprises a substantially flat insulative housing defining an array of passagewayways with electric contacts received therein. An IC module connects with the LGA socket for establishing electrical connection to the PCB. Each contact has a pair of free ends projecting beyond two opposite external surfaces of the socket housing for respectively engaging with corresponding pads on a bottom surface of the IC module and on a top surface of the PCB.

Referring to FIG. 1, a conventional LGA socket is illustrated. The LGA socket comprises an insulative housing 31 receiving a plurality of electronic terminals 80 arrayed therein for electrically connecting an IC module 41 and a PCB 51. Each terminal 80 includes a retention portion 81, a pressing arm 84 extending upwardly and obliquely from a top end of the retention portion 81, and a contacting arm 86 extending downwardly and obliquely from another end of the retention portion 81. A pressing portion 842 stretches forwardly from the pressing arm 84 and extends beyond an upper surface of the insulative housing 31. The pressing portion 842 contacts a corresponding pad 412 mounted on the IC module 41 for achieving an electrical connecting therebetween. The contacting portion 86 extends beyond a lower surface of the insulative housing 31 and contacts a corresponding pad of the PCB 51. Therefore, electrical connection between the IC module 41 and the PCB 51 is built.

One problem with this design of the terminal is that a path of transmission electric current is too long so that exceeding impedance will cause EMF (electromotive force) to make the electric signal stumble.

Hence, a new LGA contact is desired to overcome the aforesaid disadvantages of the prior art.

SUMMARY OF THE INVENTION

Accordingly, a main object of the present invention is to provide a land grid array (LGA) socket having an improved terminal which can reduce impedance to ensure transmission performance in a high frequency transmission signals state.

To fulfill the above-mentioned object, a LGA socket in accordance with the present invention is provided. The socket comprises an insulative housing having a plurality of passageways, a plurality of electrical terminals being received in the passageways of the insulative housing. Each of the terminals includes a retention portion, a pressing arm being bent slantwise and extending upwardly from an end of the retention portion, a contacting arm being bent slantwise and extending downwardly from another end of the retention portion. At least one connecting plate connects the pressing arm and the contacting arm, and the at least one connecting plate disconnects the retention portion.

DETAILED DESCRIPTION OF PREFERRED EMBODIMENT

Reference will now be made to the drawings to describe the present invention in detail.

Referring to FIGS. 2–5, an LGA socket 1 in accordance with a preferred embodiment of the present invention is illustrated. The LGA socket 1 connects an IC module 40 and a PCB 50 for establishing electrical connection between the IC module 40 and the PCB 50. The LGA socket 1 comprises an insulative housing 30 and a plurality of terminals 10 retained in the insulative housing 30.

Figure 1:
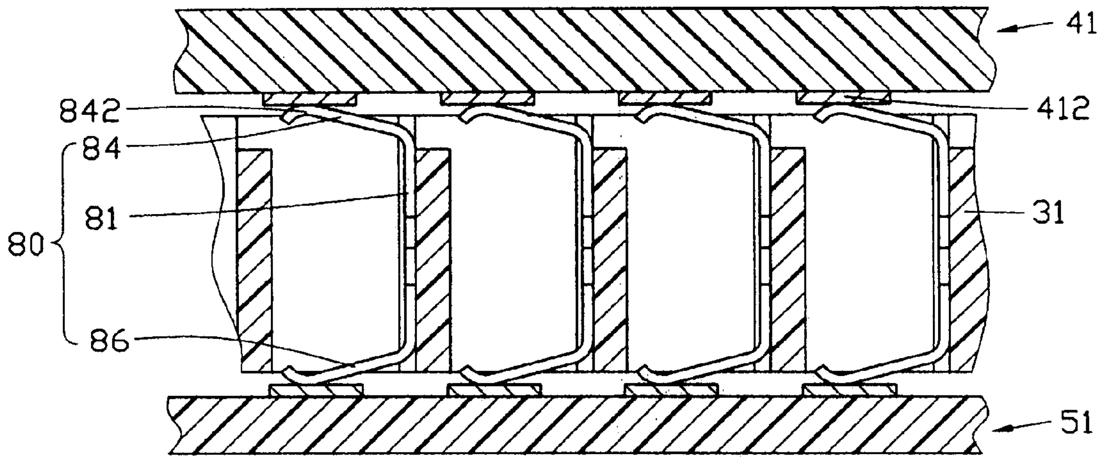
FIG. 1 (PRIOR ART)
FIG. 1 is an assembled, cross-sectional view of an LGA assembly in accordance with a prior art.
Figure 2:
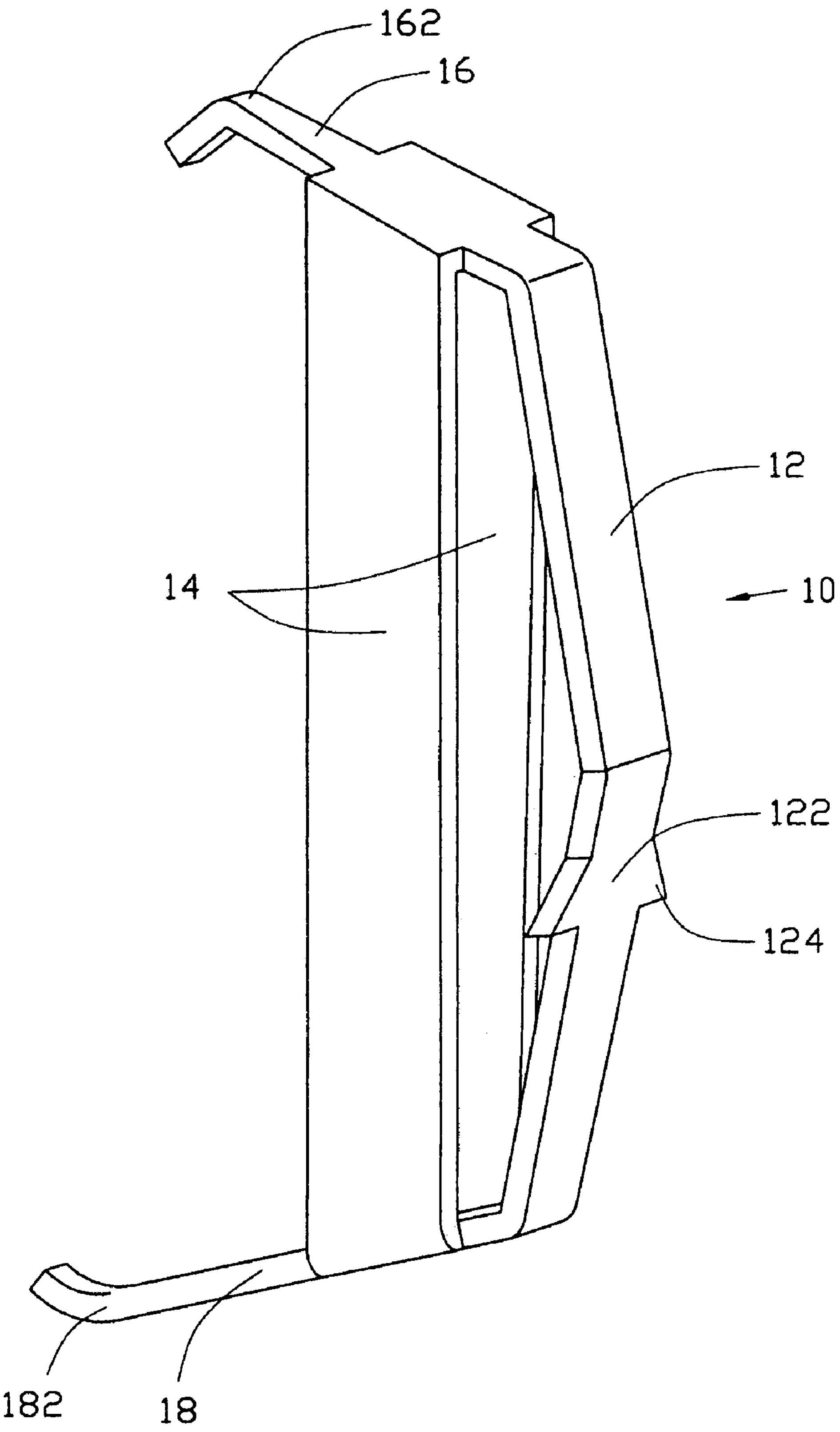
FIG. 2 is an isometric and perspective view of a terminal of the present invention.
Figure 3:
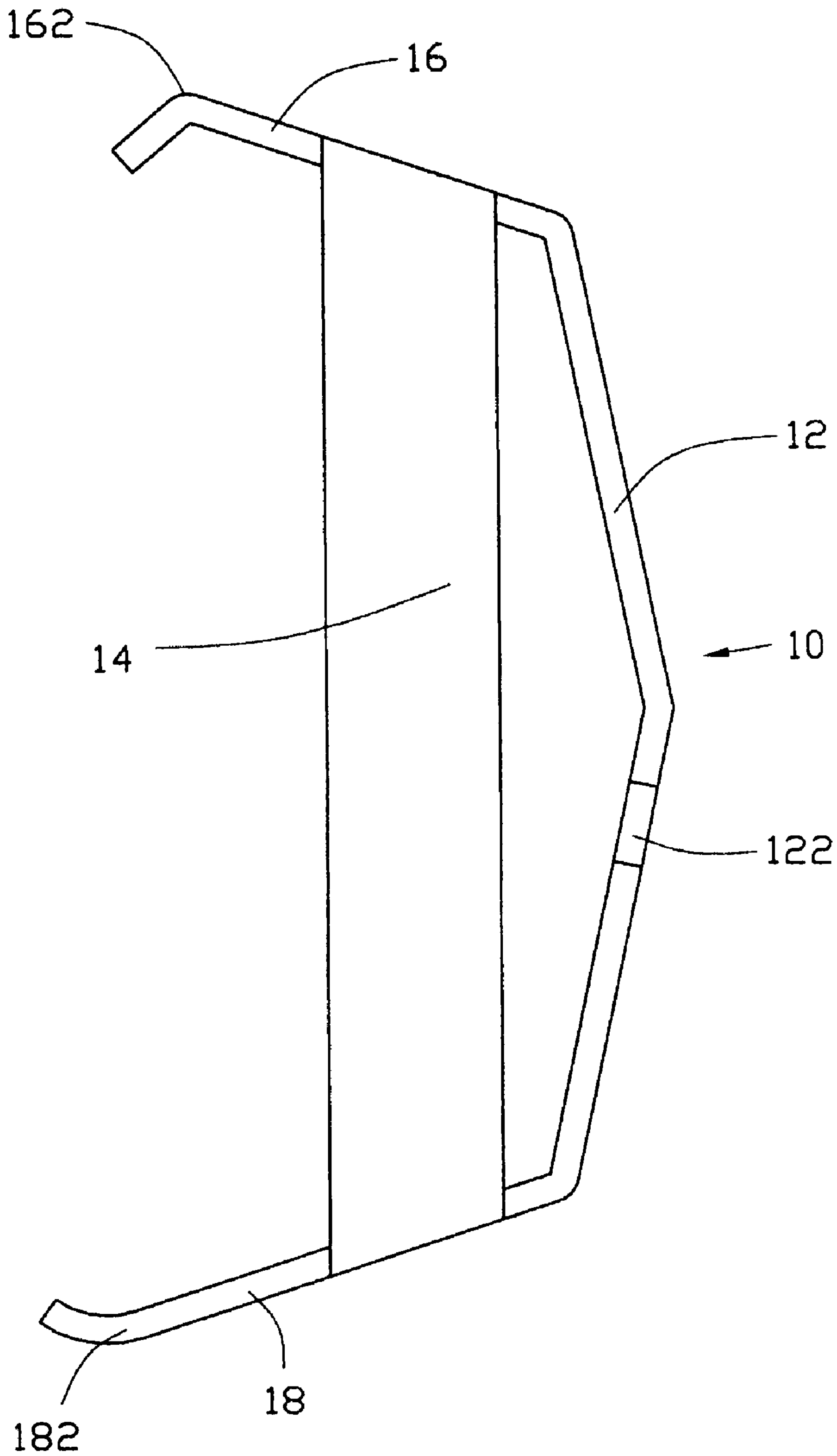
FIG. 3 is a side view of the terminal of FIG. 2.

Referring to FIGS. 2 and 3, each terminal 10 comprises a retention portion 12 having a fixing portion 122. A pair of barbs 124 is formed on opposite sides of the fixing portion 122. A contacting arm 18 bends on slantwise and extends downwardly from a lower end of the retention portion 12. A curved contacting portion 182 is configured on a free end of the contacting arm 18. A pressing arm 16 extends obliquely and upwardly from the retention portion 12. A curved pressing portion 162 is formed on a free end of the pressing arm 16. Two connecting plates 14 connect both sides of the pressing arm 16 and the contacting arm 18. The connecting plates 14 and the retention portion 12 are separated and have a distance therebetween, but the connecting plates 14 and the retention portion 12 are close to each other. The pressing arm 16 and the contacting arm 18 spread beyond the upper and lower surfaces of the insulative housing 30 so that better resilience can be provided while stress is produced.

The terminals 10 are received in corresponding passageways 302 of the insulative housing 30. The retention portion 12 of each terminal 10 has a central part leaning against an internal side wall of the corresponding passageway 302 of the insulative housing 30. The barbs 124 of the fixing portion 122 interference corresponding side walls of the passageway 302 to secure the terminal 10 in the passageway 302. The pressing portion 162 and the contacting portion 182 extend beyond the upper and lower surfaces of the insulative housing 30, respectively.

Figure 4:
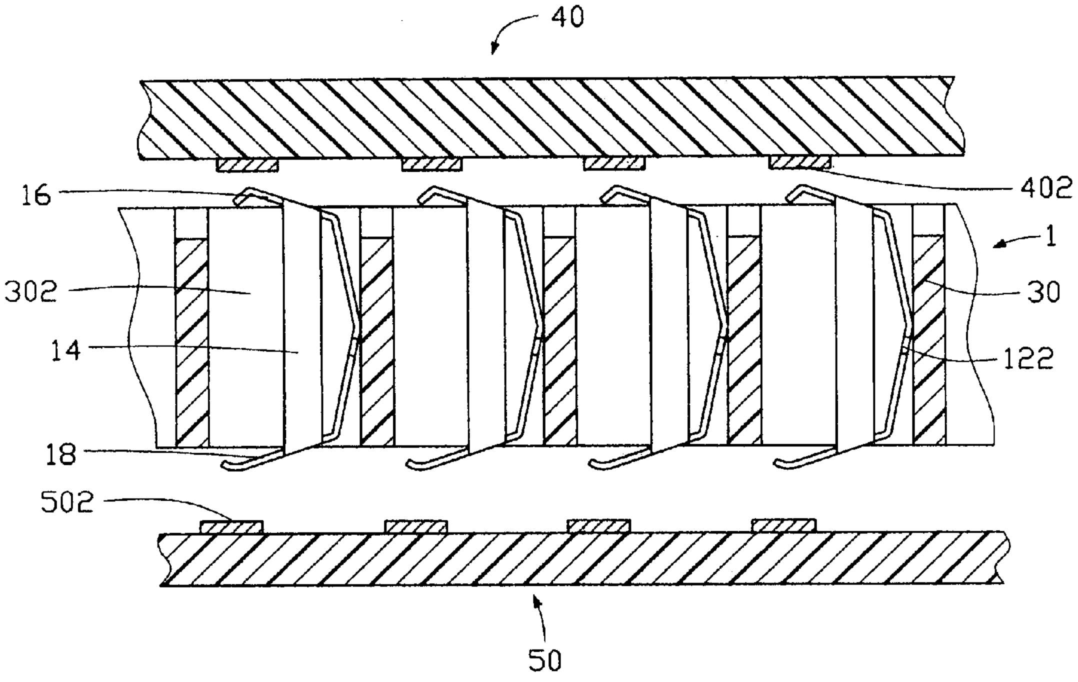
FIG. 4 is a cross-sectional view of an LGA assembly in accordance with the present invention.
Figure 5:
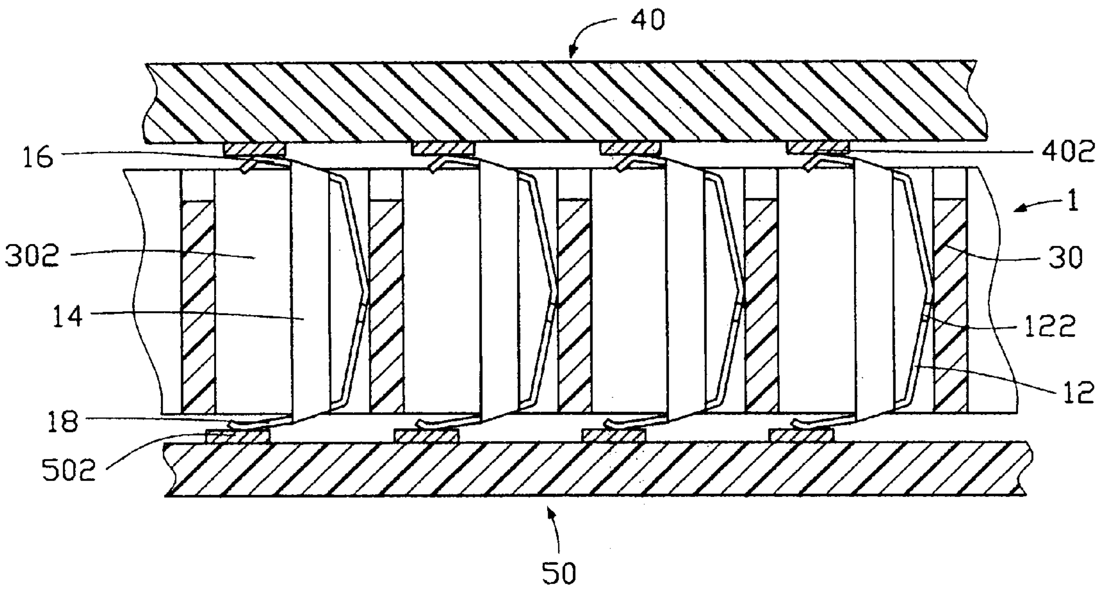
FIG. 5 is a assembled, cross-sectional view of the LGA assembly of FIG. 4.

Referring to FIGS. 4 and 5, when the IC module receives a pressure, both of the pressing arm 16 and the contacting arm 18 will undergo elastic deformation and abut against the corresponding pads (402, 502) of the IC module and the PCB 50, respectively. Hence, the IC module 40, the PCB 50 and the LGA socket 1 together construct electrical connection therebetween. At this time, there are three separate electrical paths between the pressing arm 16 and the contacting arm 18, namely, the two connecting plates 14 and the retention portion 12 to transmit signals with this structure of the terminal 10 compare to the prior art, when signals of the electrical currents change, this new design can reduce electrical resistance of the terminal 10, and the electric inductance coefficient of the terminal 10 is also decreased. So, this terminal design can avoid the terminal 10 from subjecting to excessive EMF (electromotive force) to obstruct any variation of signals that causes signal stumble under high frequency transmission signals environment.

The connecting plates 14 are not required to be particularly arranged in both sides of the pressing arm 16 and the contacting arm 18, and the number of the connecting plates 14 is not limited. If only any extra electrical path is added between the pressing arm 16 and the contacting arm 18 for reducing impedance therebetween and decreasing electrical inductor of the terminal 10, equivalent modifications and changes known to persons skilled in the art according to the spirit of the present invention are considered within the scope of the present invention as defined in the appended claims.

What is claimed is:

1. A LGA socket adapted to receive an IC module and be mounted on a PCB, the socket comprising:

an insulative housing having a plurality of passageways;

a plurality of electrical terminals being received in the passageways of the insulative housing, respectively, each of the terminals including:

a retention portion secured to the passageway;

a pressing arm bent slantwise and extending upwardly from an end of the retention portion;

a contacting arm bent slantwise and extending downwardly from another end of the retention portion;

at least one connecting plate integrally connecting the pressing arm and the contacting arm and being separate from the retention portion; wherein the at least one connecting plate comprises two connecting plates connecting the pressing arm and the contacting arm, respectively; wherein the two connecting plates are placed close to the retention portion; wherein the pressing arm and the contacting arm respectively form a curved pressing portion and a curved contacting portion at corresponding free ends thereof; wherein there are at least two electrical paths between the pressing arm and the contacting arm; wherein said at least one connecting plate is formed on middle portions of two sides of the pressing arm and the contacting arm; wherein said connecting plate is vertically disposed between the pressing arm and the contacting arm.

2. A LGA socket for establishing electrical connection between an IC module and a PCB, the socket comprising:

an insulative housing having a plurality of passageways;

a plurality of electrical terminals being received in the passageways of the insulative housing, each of the terminals including:

a retention portion;

a pressing arm connecting a free end of the retention portion;

a contacting arm connecting another free end of the retention portion;

at least two electric paths being built between the pressing arm and the contacting arm before electrical connection of the terminal with the IC module and the PCB; and wherein at least one of the electric path is built on middle portions of two sides of the pressing arm and the contacting arm; wherein the at least two electric paths comprise two connecting plates connecting the pressing arm and the contacting arm to transmit current therealong; wherein the two connecting plates and the retention portion separate from each other, and three electrical paths are built between the pressing arm and the contacting arm; wherein each of the connecting plates is placed close to the retention portion; wherein the two connecting plates are separate from each other and connected to both sides of the pressing arm and the contacting arm; wherein the retention portion has a fixing portion having at least one barb to interference with an internal wall of a corresponding passageway of the insulative housing for securing the terminal on the insulative housing; wherein said at least one of the electric path comprises a connecting plate integrally formed with the middle portions of the pressing arm and the contacting arm; wherein the remaining one electric path other than said electric path associated with said connecting plate is configured to extend through the retention portion.

* * * * *